(12) United States Patent
Chung et al.

(10) Patent No.: US 8,873,689 B2
(45) Date of Patent: Oct. 28, 2014

(54) PHASE INTERPOLATOR FOR CLOCK DATA RECOVERY CIRCUIT WITH ACTIVE WAVE SHAPING INTEGRATORS

(75) Inventors: Tao Wen Chung, San Jose, CA (US);
Chan-Hong Chern, Palo Alto, CA (US);
Ming-Chieh Huang, San Jose, CA (US);
Chih-Chang Lin, San Jose, CA (US);
Yuwen Swei, Fremont, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 20 days.

(21) Appl. No.: 13/564,758

(22) Filed: Aug. 2, 2012

(65) Prior Publication Data
US 2014/0037035 A1 Feb. 6, 2014

(51) Int. Cl.
*H04L 7/00* (2006.01)
(52) U.S. Cl.
USPC ....... 375/355; 370/395.62; 398/155; 713/400
(58) Field of Classification Search
None
See application file for complete search history.

(56) References Cited

U.S. PATENT DOCUMENTS

| | | | |
|---|---|---|---|
| 4,278,843 A * | 7/1981 | Hestad | 379/204.01 |
| 5,554,945 A * | 9/1996 | Lee et al. | 327/105 |
| 7,315,596 B2 | 1/2008 | Payne et al. | |
| 8,116,418 B2 | 2/2012 | Chien | |

OTHER PUBLICATIONS

Yang, C.K.K., "Delay-Locked Loops-An Overview", Phase-Locking in High Performance Systems, IEEE Press, 2003, pp. 13-22.

* cited by examiner

*Primary Examiner* — Adolf Dsouza
(74) *Attorney, Agent, or Firm* — Duane Morris LLP (57) ABSTRACT

A phase interpolator for a CDR circuit produces an output clock having level transitions between the level transitions on two input clocks. The input clocks drive cross-coupled differential amplifiers with an output that can be varied in phase by variable current throttling or steering, according to an input control value. The differential amplifiers produce an output signal with a transition spanning a time between the start of a transition on the leading input clock up to the end of the transition on the lagging input clock. The output clock is linear so long as the transitions on the two input clocks overlap. Active integrators each having an amplifier with a series resistance and capacitive feedback path are coupled to each input to the cross-coupled differential amplifiers, which enhances overlap of the input clock rise times and improves the linearity of the interpolated output signal.

15 Claims, 7 Drawing Sheets

PHASE INTERPOLATOR FOR CLOCK DATA RECOVERY CIRCUIT WITH ACTIVE WAVE SHAPING INTEGRATORS

BACKGROUND

This disclosure relates to a clock and data recovery ("CDR") circuit having a phase interpolator producing an output signal with edges that are controlled in phase position so as to fall at a required phase position between two phase signals that are earlier and later than a targeted phase position.

CDR circuits are useful, for example, in decoding high data rate serial data streams transmitted between two digital devices, without the need to transmit a separate clock signal as a timing reference for decoding or synchronizing with the serial data stream. A reference clock is regenerated at the receiving device using a controllable oscillator in a phase locked loop or a controllable delay in a delay locked loop. Feedback controls cause the controllable oscillator or delay to generate a local clock signal that is locked onto a frequency and phase that matches the transitions in the serial data stream. The regenerated clock produced from the data signal is used at the receiver device to synchronize decoding operations with the transmitter clock. Operations are synchronized without the need to couple directly with the transmitter clock signal.

Advantageously, the phase position of the regenerated clock is adjustable more finely than the phase difference between phase subdivisions, by interpolating between the transitions of two phase subdivisions. An output phase signal is adjusted such that transitions in the output phase signal occur at an adjustable time between leading and lagging phase subdivisions.

What is needed are circuits and techniques that optimize and improve phase interpolations devices and techniques.

SUMMARY

An object of this disclosure is to improve the signal shaping of a phase interpolated output signal, namely a periodic digital clock signal having level transitions that occur at a controllable phase position between level transitions in two input signals.

This and other objects are achieved by a phase interpolator and a phase interpolation method, for use in a CDR or similar circuit employing the phase interpolator. The phase interpolator is coupled to two input signals having voltage level transitions that are spaced in phase, and produces an output signal with voltage level transitions interpolated to occur at a phase position between the transitions of the two phase-spaced input signals. The phase interpolator has two amplifier stages respectively coupled to the input signals with the voltage level transitions at a relative phase difference. The amplifier stages are cross coupled such that levels of both input signals contribute to generating the level transitions in the output signal.

In an embodiment, a current steering control is coupled to the respective amplifier stages, for distributing bias current between the cross coupled differential amplifier stages such that a phase position of the level transitions in the output signal is controlled to occur between the level transitions of the input signals. The current steering control causes the output transition to occur nearer to the input transition that is leading or trailing the other input transition, according to the current steering control.

Provided that the input voltage transitions overlap for a time during which the output transition ramps from one level to another, the output signal transition follows a linear ramp. For improving the linearity of the output transition, it is an aspect of this disclosure that an integrators on the input signals reduce the input signal rise time, thereby ensuring or extending the duration of the time during which the input signals overlap. As a result, the phase interpolated output signal contains smooth rising and falling transitions that are useful in a CDR circuit for decoding a serial data stream.

Therefore, a phase interpolator for a CDR circuit produces an output clock having level transitions occurring between the level transitions on two input clocks that can be derived from phase rotation, early/late majority rules or the like. The input clocks drive cross-coupled differential amplifiers that can be varied in phase by current throttling based on an input control value. The differential amplifiers produce an output signal with a transition spanning a time between the start of a transition on the leading input clock up to the end of the transition on the lagging input clock. The output clock is linear so long as the transitions on the two input clocks overlap. Active integrators each having an amplifier with a series resistance and capacitive feedback path are coupled to each input to the cross-coupled differential amplifiers, which enhances overlap of the input clock rise times and linearity of the interpolated output.

The associated interpolation method includes providing two input clock signals having level transitions with rise times on transitions that are spaced to define a phase window during which a transition is to occur in the output clock signal, and determining a phase position in the window at which a transition is to occur. The two clock signals are coupled as inputs to cross coupled amplifiers such that an output of the cross-coupled amplifiers carrying the output clock signal has a level transition with a rise time that spans at least part of the rise times of the two input clock signals. By integrating the input clock signals, the rise times of the level transitions of the two input clock signals are extended. As a result, the level transition of the output clock signal has improved linearity. By coupling active integrating amplifiers to the inputs, the linearity of the output is particularly enhanced.

BRIEF DESCRIPTION OF THE DRAWINGS

These and other objects and aspects will be appreciated by the following discussion of some embodiments and examples, with reference to the accompanying drawings, wherein.

DESCRIPTION OF EXEMPLARY EMBODIMENTS

A clock data recovery (CDR) circuit presents certain challenges compared to a phase locked arrangement that locks onto a continuous clock signal. A continuous clock has dependable transitions at each clock cycles but serial data values are variable and might or might not have a transition at any given clock cycle. Data may be encoded in formats that are more or less adapted for CDR recovery. Return-to-zero (RZ) and Non-return-to-zero (NRZ) binary encoding techniques differ with respect to the frequency of transitions in the signal produced when encoding serial binary data streams. Manchester code similarly transmits a data signal with levels representing the exclusive OR of the transmitter clock and the data value.

Using these encoding techniques, transitions may be more or less frequent, but transitions in the data signal occur less frequently than the transitions in the clock signal with which the data was synchronously transmitted. Regenerating the clock signal and decoding the serial data at the receiving device requires a clock generator and a controller that track the frequency and phase of the transmitter clock, using only the transitions in the data as an input. The tracking of transitions between data values and corresponding control of the frequency of the regenerated clock and also the phase angle at which transitions occur, is needed so that the levels that determine the data valued in the serial signal can be sampled at optimal times.

For this purpose, CDR devices employ a local clock generator at the receiver device, with a controllable oscillator or a controllable delay, responsive to the transitions in the data signal. A feedback loop is arranged to advance or retard the phase of a reference clock signal produced locally at the receiver. There is a tradeoff between the responsiveness of the feedback loop and the stability of the locally generated clock signal. If the feedback control is overly responsive, intermittent differences in the frequency of transitions in the data signal cause jitter in the locally generated clock signal and consequent deterioration in the accuracy of data decoding. If the feedback is overly damped, the control is slow at locking onto the frequency of the transmitting clock as represented by transitions in the data.

Techniques are available for controlling the local clock signal at the receiver to gain both responsiveness and stability. In some arrangements, phase subdivisions of the locally generated clock signal are employed. For example, plural versions of the receiver clock signal can be generated, at eight or sixteen or some other number of evenly spaced phase positions within the cycle of the regenerated receiver clock. When transitions occurring in the data signal suggest that the regenerated clock is leading or lagging the transmitter clock, for example by determining that a majority of data transitions in some grouping are early or late of an expected time based on the phase subdivisions, the phase of the regenerated clock is adjusted. The phase of the regenerated clock might be shifted incrementally from one phase subdivision to another, but even if the subdivisions are a small phase angle, that will cause jitter.

Figure 1:
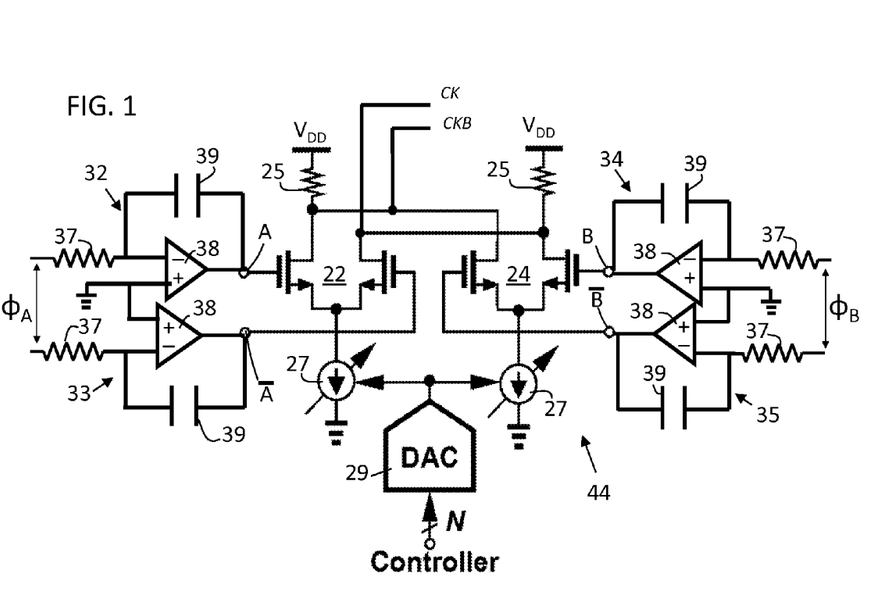
FIG. 1 is a schematic diagram showing a phase interpolator for clock data recovery circuits, including active wave shaping integrators according to one embodiment.

FIG. 1 is a schematic diagram showing a phase interpolator 44 for clock data recovery circuits according to an embodiment of the present disclosure. Active wave shaping integrators 32-35 are shown coupled between the terminals $\phi_A$ and $\phi_B$ at which two input clock signals are coupled to the phase interpolator, and nodes A, A-bar and B, b-bar, in differential form.

In this embodiment, the phase interpolator has two differential amplifiers 22, 24 that are cross coupled in that one of the two transistors of each differential amplifier 22 or 24 is coupled to the power supply $V_{DD}$ through a bias transistor 25 that is shared with a transistor of the other amplifier 22, 24. The two amplifiers 22, 24 conduct current to the extent that current throttles 27 permit. The current throttles are controlled by control voltages produced at two outputs of a digital to analog converter 29. The DAC 29 apportions the amplitudes of current conduction of the tail currents of differential amplifiers 22, 24, allowing one to conduct an increased current amplitude at the expense of throttling the other to a permit only a reduced current amplitude and vice versa. The overall effect is to adjust the timing of transitions on the output signal CK, CK-bar to a phase position between the transitions on the input signals as selected by a numeric control value N, coupled to the DAC 29.

Figure 2:
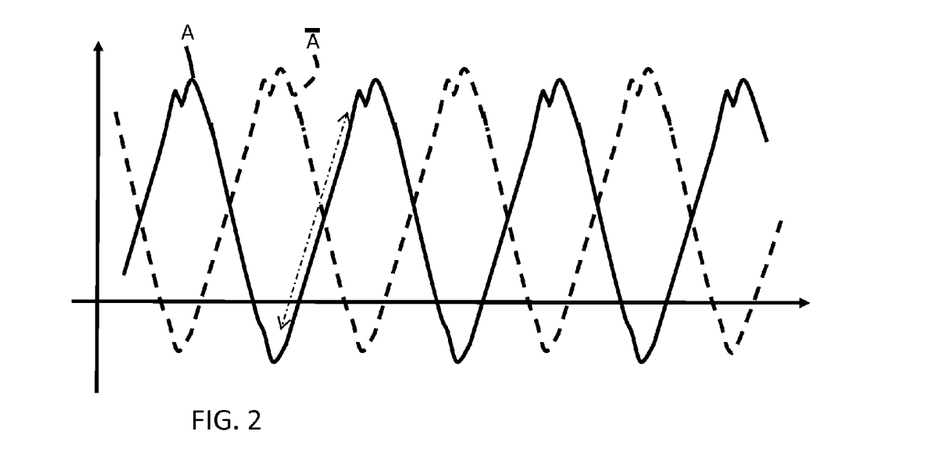
FIG. 2 is a time diagram showing transitions at the terminals of A, $\overline{A}$ in FIG. 1.

Due to operation of the integrators 32, 33, 34, 35, and as shown in the voltage-time diagram of FIG. 2, the time integration of signal $\phi_A$ at nodes A, A-bar, has a straight line voltage-time wave shape characteristic over the portion of the cycle shown by the double headed dash-dot arrow. The integration of signal $\phi_B$ at nodes B, B-bar has a similar shape (not shown) but leads or lags the phase of signal $\phi_A$. It is the function of the phase interpolator to produce a signal at output CK, CK-bar that is timed such that transition on the output signal occur at a phase position between the transitions on the two input signals $\phi_A$ and $\phi_B$. In the phase interpolator shown in FIG. 1, a numeric signal N is generated by a controller (not shown) to define the extent to which the output signal occurs nearer to the leading or lagging input signal transition, in the time window between the leading and lagging signal transitions.

The integrators 32-35 in this embodiment are active integrators each having a series resistor 37, a high gain amplifier 38 and a negative feedback path containing a capacitor 39. FIG. 1 illustrates the amplifiers 38 as differential op amps, but other configurations are likewise possible.

Figure 3:
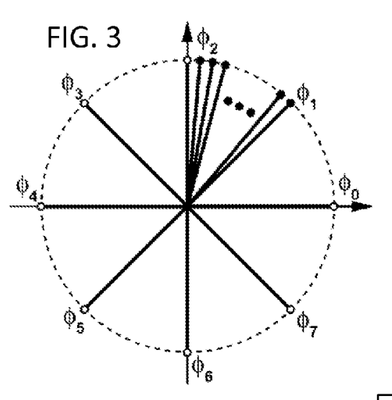
FIG. 3 is a graphic diagram showing plural phase reference positions in a cycle.
Figure 4:
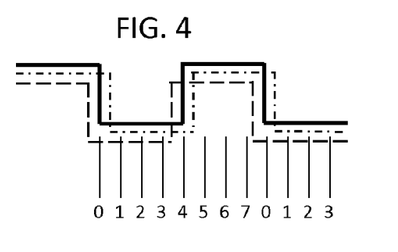
FIG. 4 is a time diagram showing three such phase positions versus time.

FIGS. 3 through 7 generally illustrate aspects of exemplary clock data recovery apparatus of which the phase interpolator is an element. In FIG. 3, the period of a clock cycle, especially of the regenerated clock at the receiver of a serial data communication path, is shown as a unit circle with eight phase position references $\phi_1$ through $\phi_7$ at equally spaced angles. FIG. 4 shows the corresponding timing diagram, wherein the reference clock, shown in solid lines, may lead or lag clock signals such as those shown in broken lines. The level transitions in the clock signals occur earlier or later than the phase references, including $\phi_0$, the phase of the regenerated receiver clock.

Figure 5:
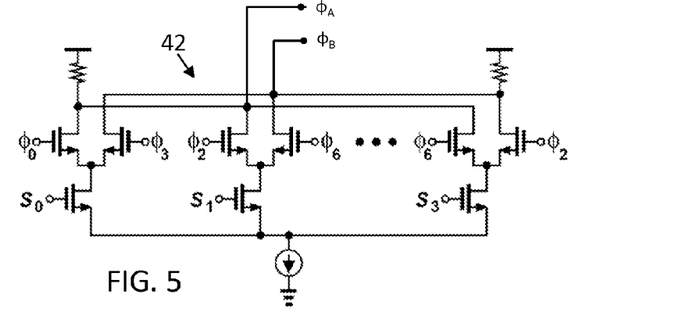
FIG. 5 is a schematic diagram illustrating a circuit for time division multiplex selection of two phases, thereby selecting two level transitions, between which a transition shall be generated by interpolation.
Figure 6:
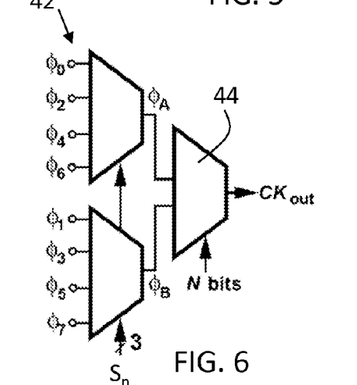
FIG. 6 is a logic diagram functionally representing the circuits shown in FIGS. 5 and 7.

One can compare the timing of transitions that occur in the serial data signal to the timing of transitions in the clock, and over a response period determine that the regenerated clock needs to be adjusted in phase. Early/late determinations can be made using widely spaced or closely spaced phase references. In FIG. 5, a multiplexing device 42 is provided in a configuration of coupled differential amplifiers selected by time division multiplex signals $S_0$ through $S_3$, wherein the phase references are at 180 degrees ($\phi_2$-$\phi_6$) or 135 degrees ($\phi_0$-$\phi_3$). As shown by FIG. 3, the received phase could fall at a point between adjacent phase references. Various specific techniques can be used for making phase comparisons between reference points and determining the early and late phase references between which the an output clock phase is to be set by appropriate controls. The output of the multiplexer 42 in FIG. 5 is two clock signals $\phi_A$ and $\phi_B$ that are phase spaced, i.e., their transitions are spaced in time. An output clock phase $CK_{OUT}$ is to be generated by a phase interpolator 44 shown in FIG. 7. FIG. 6 is a logic diagram representation showing the elements of FIGS. 5 and 7 as operatively coupled.

Figure 7:
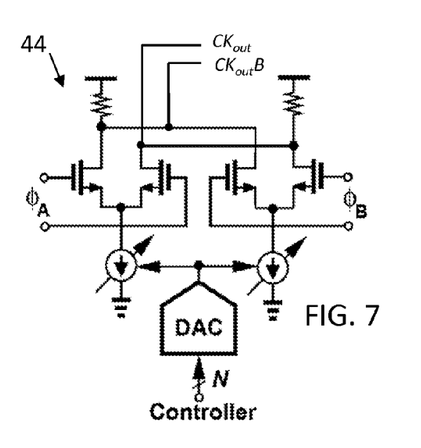
FIG. 7 is a schematic diagram showing an interpolator circuit operable to produce an output signal $CK_{out}$ with transitions occurring at a timed point between transitions on signals $\phi_A$ and $\phi_B$, and wherein the timing of the transitions on the output signal are adjusted by the two outputs of a digital to analog converter according to factor N.

A numeric controller such as a second order digital control loop (not shown in detail) can produce a numeric value to the DAC in FIG. 7. The particular phase position of the output clock phase relative to the two clock signals $\phi_A$ and $\phi_B$ is timed to occur at the required phase position by the DAC steering the currents in the two cross coupled amplifiers toward one or the other, thereby shifting the phase of the output transition toward one side or the other of the phase window between the corresponding transitions on clock signals $\phi_A$ and $\phi_B$.

Figure 8:
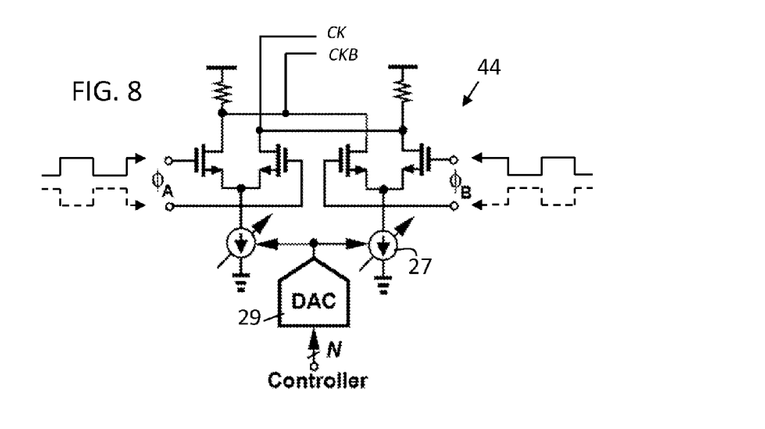
FIG. 8 is a schematic diagram of a phase interpolation output circuit.
Figure 9:
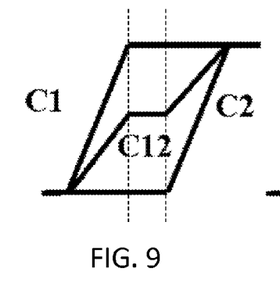
FIG. 9 is a voltage-time diagram showing an output of the phase interpolation circuit of FIG. 8 when the transitions in signals $\phi_A$ and $\phi_B$ are spaced in time (i.e., the transitions C1, C2 do not overlap for a time duration.
Figure 10:
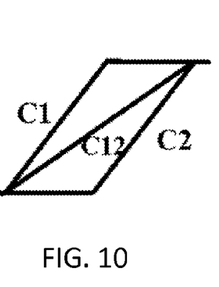
FIG. 10 is a voltage-time diagram showing a desired phase interpolated output signal.

The clock signals $\phi_A$ and $\phi_B$ are differential digital signals as shown in FIG. 8, typically voltage transitions between logic levels. Although the clocks are nominally square waves, they have a rise time. During the rise time of a transition on one of the clock signals $\phi_A$ or $\phi_B$, the output signal CK ramps up, and the transition on either signal clock signals $\phi_A$ or $\phi_B$ contributes. However when the transitions in the clock signals do not overlap an instead one signal is high and the other low, there is no contribution and the amplitude of the output signal CK remains at its current amplitude. FIGS. 9 and 10 show that if a linear transition of an interpolated signal C12 produced by interpolator 44 of FIG. 8 is to be produced, in this case halfway between transitions C1 and C2 on input signals $\phi_A$ and $\phi_B$, the transitions C1 and C2 need to overlap in time. That is, the beginning of the rising edge of the lagging signal C2 needs to occur before the end of the rising edge of the leading signal C1 if the interpolated signal C12 is to be linear. Otherwise, as shown in FIG. 9, the wave shape is not linear and there may be issues as to the point in time at which transition C12 crosses a given switching threshold of a downstream device responsive to the interpolated clock signal CK.

Figure 11:
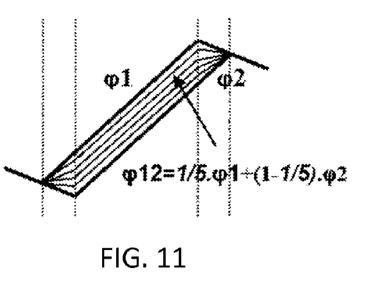
FIG. 11 is a voltage-time diagram showing a practical phase interpolation signal produced according to the present disclosure, between transitions at phases $\phi_1$ and $\phi_2$.

FIG. 11 shows that the interpolator 44 also has a phase adjustment function in that the digital to analog converter 29 proportions the tail currents in the cross-coupled differential amplifier stages via current throttle controls 27, so as to favor leading or trailing phases and thereby adjust the precise phase of transitions on output signal CK. However, this also relies to an extent on the transitions C1 and C2 (or $\phi_1$ and $\phi_2$ in FIG. 11) overlapping.

Figure 12:
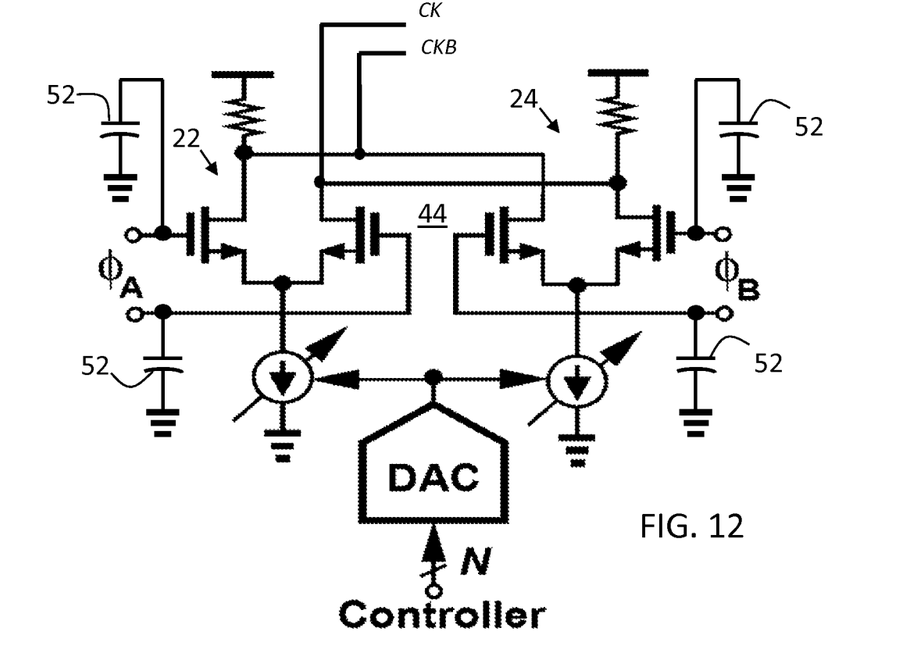
FIG. 12 is a schematic diagram showing an embodiment wherein capacitive loading is coupled to the respective inputs of a phase interpolation circuit.
Figure 13:
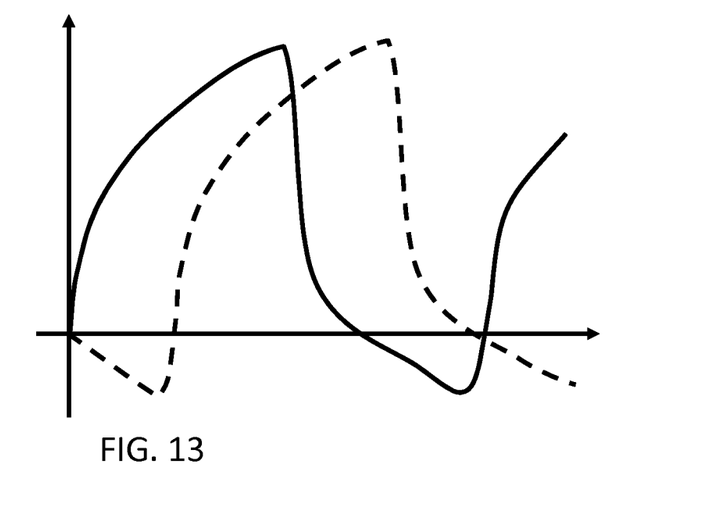
FIG. 13 is a time diagram showing signals at the terminals of input signal $\phi_A$, as affected by capacitive loading.

One way to extend the time of the rising edge of a nominal square wave signal is to introduce capacitive loading along the signal propagation path, shown schematically in FIG. 12 as parallel capacitors 52 on each of the differential inputs of signals $\phi_A$ and $\phi_B$ into interpolator circuit 44. Assuming a square wave input signal (having a relatively short rise time), the voltages at terminals $\phi_A$ and $\phi_B$ when loaded by capacitors 52 charges up to the high voltage logic level through the resistance of the source signal, producing a charging voltage wave shape as shown in FIG. 13, with a time constant $e^{-t/RC}$. Likewise when the square wave input falls to the low level, the voltage on the capacitor 52 discharges through the resistance of the input of the associated transistor and differential amplifier stage. Such exponential charging extends the rise time of the input signal, which is useful, but introduces nonlinearity into the input signals that degrades the accuracy of phase interpolation.

Figure 15:
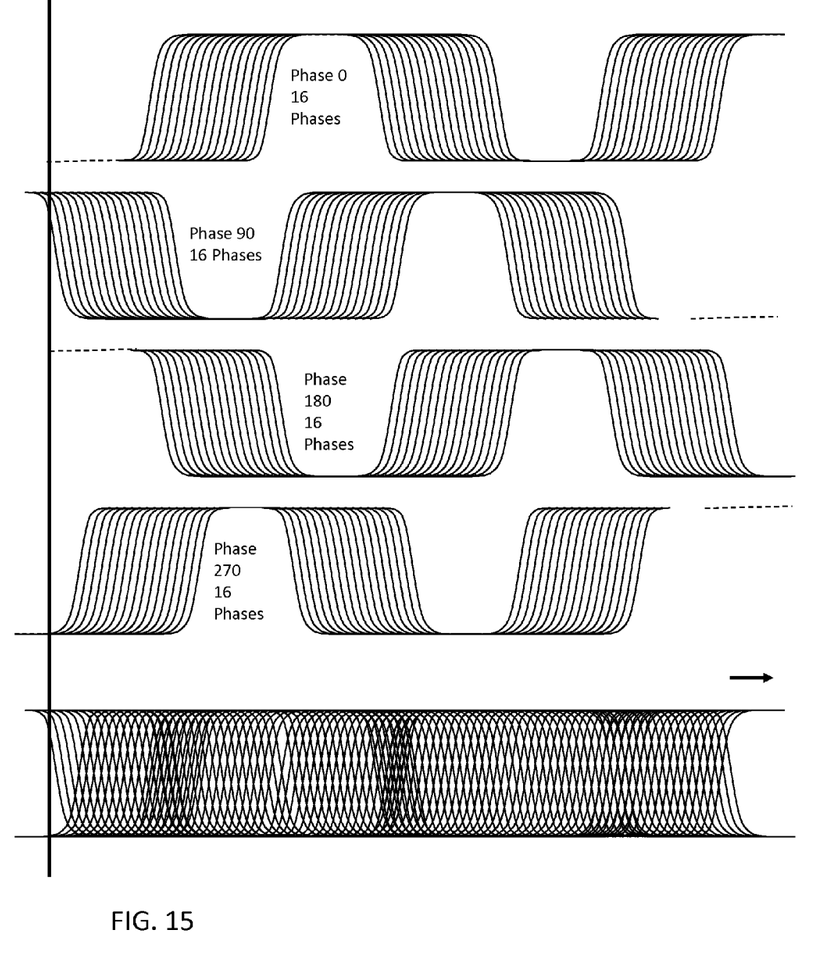
FIG. 15 is a timing diagram showing the generation of sub-phase signals at quadrature phase intervals.
Figure 16:
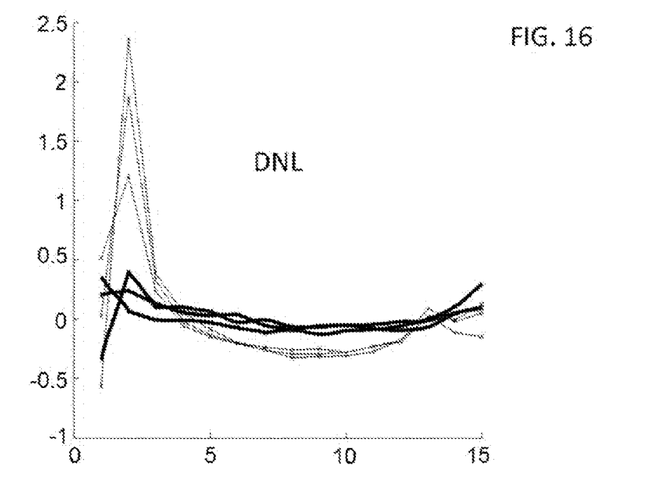
FIG. 16 is a graph comparing differential linearity measure DNL for FIGS. 1 and 2, using active integrators, versus the same measure for FIGS. 12 and 13, using capacitive loading.
Figure 17:
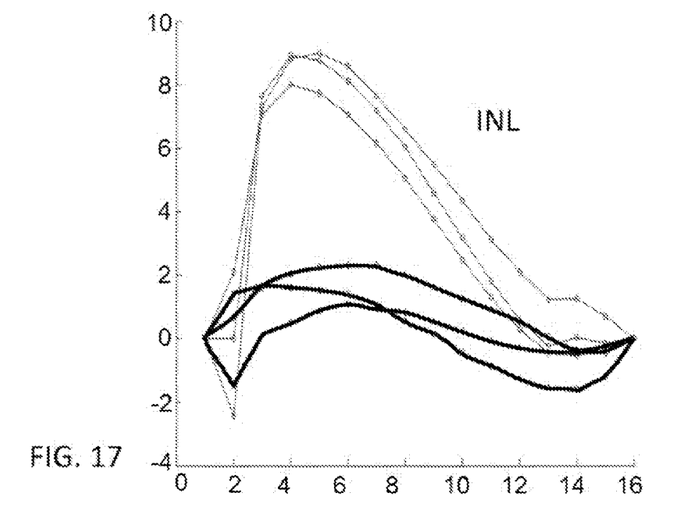
FIG. 17 is a graph comparing integral linearity measure INL for FIGS. 1 and 2, using active integrators, versus the same measure for FIGS. 12 and 13, using capacitive loading.

An object of the phase interpolation is to produce a set of phase references and to enable accurate interpolation, for example between selected pairs of quadrature signals as shown in FIG. 15, wherein a plurality of reference phases (16 phase spaced iterations being shown for each 90 degree spaced phase). Smooth and linear transitions are needed as apt for triggering logic devices having voltage switching thresholds. Accordingly, the embodiment of FIGS. 1 and 2 employs active integration to provide a straight and linear ramp. Unlike the exponential charging of the capacitors 52 in FIG. 12, producing the voltage-time plot shown in FIG. 13, the active integrators of FIG. 1 with a square wave input signal produce a ramp charging linearly from zero to a high level and discharging linearly as well. With appropriate time constants, the inputs at $\phi_A$ and $\phi_B$ have saw tooth wave shapes. The transitions on the phase spaced input signals overlap over a substantial part of the clock cycle and the output interpolated signal is linear. FIG. 16 is a graph comparing differential linearity measure DNL for FIGS. 1 and 2, using active integrators, versus the same measure for FIGS. 12 and 13, using capacitive loading. And FIG. 17 is a graph comparing integral linearity measure INL for FIGS. 1 and 2, using active integrators, versus the same measure for FIGS. 12 and 13, using capacitive loading.

Accordingly, and as illustrated in the drawings and explained herein, a phase interpolator 44 is provided as shown in FIGS. 1 and 12, for producing an output signal CK, CK-bar, interpolated to a phase position between phases of two input signals $\phi_A$ and $\phi_B$. The interpolator 44 includes an amplifier stage 22 coupled to input signals having level transitions at a relative phase difference, the amplifier stages being cross coupled such that levels of both input signals contribute to generating level transitions in an output signal. A current steering control 27, 29 is coupled to the respective amplifier stages 22, 24. The current steering control distributes bias current between the amplifier stages 22, 24, such that a phase position of the level transitions in the output signal CK is controlled to occur between the level transitions C1, C2 of the input signals. At least one integrator 32-35 is coupled to at least one of the input signals, the integrator extending a rise time of said one of the input signals.

In the disclosed examples, the amplifier stages 22, 24 comprise two differential amplifiers. The level transitions C1, C2 are voltage transitions between logic voltage levels. The two differential amplifiers are cross coupled such that an interpolated signal C12 is generated between the onset of leading transition and the end of the lagging transition.

The current steering control comprises dual tail current throttles 27, coupled respectively to the two cross coupled differential amplifiers 22, 24. The throttles can be transistors operated in their active regions, conducting current to an extent controlled by a voltage signal from DAC 29, in turn controlled by a feedback control circuit (not shown).

In the embodiment of FIG. 1, the integrators 32-35 of the phase interpolator 44 include integrators serially coupled along each of two differential inputs to each of the two differential amplifiers 22, 24. For best accuracy and linearity, each integrator comprises an active integrator comprising an amplifier 38 with a reactive feedback loop. The values of the reactive elements are selected to accommodate the clock frequency, i.e., with smaller time constants to handle higher frequencies. More particularly, integrators 32-35 comprises an amplifier 38 with an input comprising a series input resistance 37 and a capacitor 39 in a negative feedback loop. The amplifier of the integrator in the embodiment of FIG. 1 comprises a high gain differential amplifier such as an operational amplifier, with the feedback path coupled to the inverting input and the non-inverting input coupled to a reference voltage, namely to ground. Other integrator configurations are also possible, including integrators with that are perhaps less accurate but also less expensive.

Although attention has been directed to the phase interpolator aspects, this disclosure encompasses a clock data recovery circuit that contains phase interpolation circuits as described. In that event, a phase rotator and associated controls produce at least two phase-spaced clock signals (FIGS. 3-7). A phase interpolator 44 with inputs A, A-bar, B, B-bar is coupled to the phase-spaced clock signals $\phi_A$ and $\phi_B$. The phase-spaced clock signals have level transitions C1, C2, straddling a phase window and the phase interpolator producing an output C12 with a level transition in the phase window. As described, the phase interpolator 44 comprises two cross coupled amplifier stages 22, 24 coupled to the inputs to the phase interpolator, and at least one integrator 32-35 coupled to at least one of the input signals $\phi_A$ and $\phi_B$. The integrator extends the rise time one or both of the input signals, thereby increasing or establishing an extent to which the rise times overlap in time. Moreover, embodiments wherein the integrator comprises one or more active integrators, the input wave shapes are quite linear in along the span of phase where the level transitions of the input signals overlap. This has the advantageous result that the transitions C12 in the interpolated output wave shape CK are highly linear.

The embodiments presented as examples also have a current steering control 27, 29 coupled to the respective amplifier stages 22, 24, configured to distribute bias current between the amplifier stages 22-24 such that a phase position of the level transition C12 in the output signal is controlled to occur at a particular time between the level transitions of the input signals. The current steering control variably proportions currents between the cross-coupled amplifier stages 22, 24 for adjusting a phase position of the output level transition in the phase window (FIG. 11). The current steering control comprises current throttles 27 for allowing or limiting a tail current amplitude in the differential amplifiers 22, 24. The current throttles shown are responsive to a digital to analog converter 29 numerically controlling a phase position of the output transition in the phase window.

The cross-coupled amplifier stages comprise two differential amplifiers 22, 24 and integrators 32-35, serially coupled along each of two differential inputs $\phi_A$ and $\phi_B$ to each of the two differential amplifiers 22, 24. The integrators in FIG. 1 each comprise an amplifier 38, a serial input resistance 37 and a capacitor 39 in a negative feedback loop.

Figure 14:
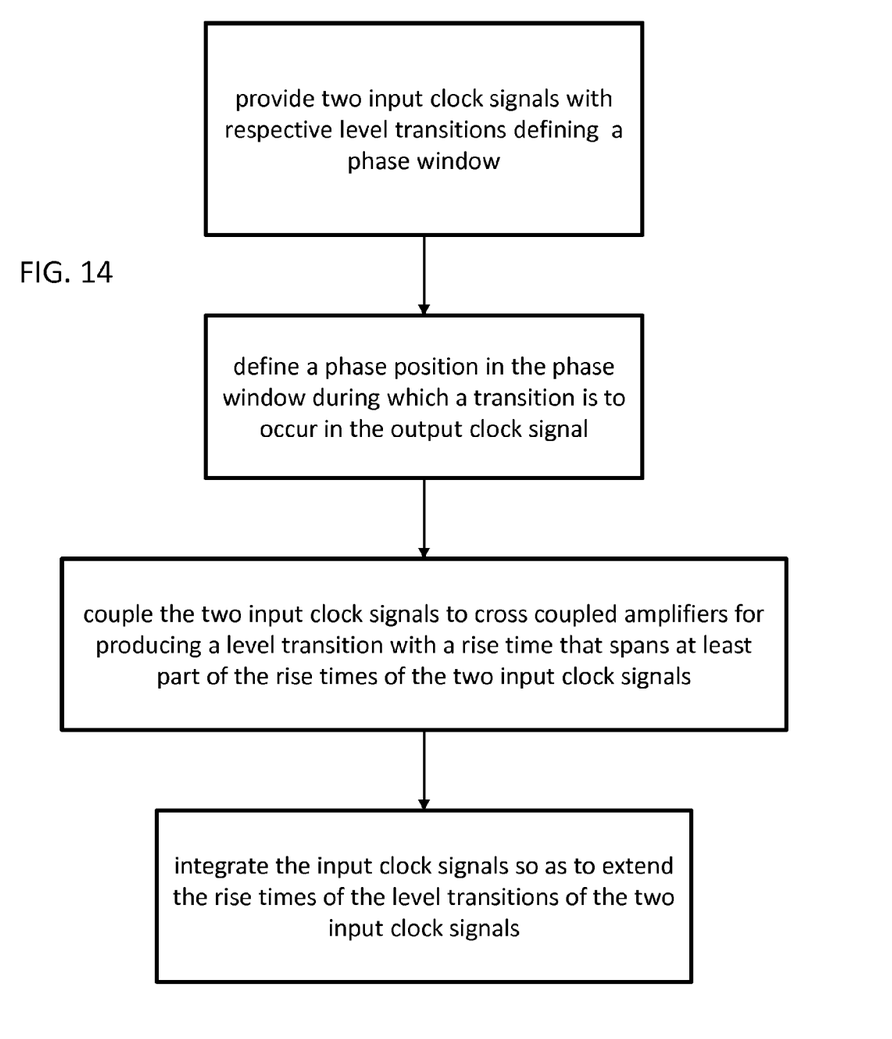
FIG. 14 is a flow chart showing the method steps entailed in establishing and operating a phase interpolation control as disclosed.

Apart from the particular circuit structures and configurations, the present disclosure encompasses a phase interpolation method, shown in flowchart form in FIG. 14. The method for providing an output clock signal with transitions that occur between the transitions of two input signals $\phi_A$ and $\phi_B$. The input clock signals or similar references have level transitions with rise times, the level transitions of the input clock signals being spaced to define a phase window during which a transition is to occur in the output clock signal, especially at a controlled phase position within the window. The input clock signals are coupled to cross coupled amplifiers 22, 24 such that an output of the cross-coupled amplifiers carrying the output clock signal has a level transition with a rise time that spans at least part of the rise times of the two input clock signals. By integrating the input clock signals (i.e., generating a signal representing the voltage integral over time), the rise times of the level transitions of the two input clock signals are extended. More particularly by actively integrating the input signals using an amplifier and feedback loop, the rise time is extended and kept linear. This also improves the linearity of the level transition of the output clock signal.

In that configuration, the integrating step comprises coupling the input clock signals through active integrating amplifiers at inputs to the cross coupled amplifiers. The active integrating amplifiers are provided with reactive elements tuned to extend the rise times of the input clock signals such that said rise times of the input clock signals overlap in time. As shown and described, the active integrating amplifiers are provided with a series resistance and a capacitive feedback path, tuned to extend the rise times of the input clock signals such that said rise times of the input clock signals overlap in time.

In addition to interpolating to a phase position between level transitions of input signals, the phase interpolators is used, for example in a CDR, for controlling a phase position of the transition in the output clock signal within the phase window between the level transitions in the input clock signal (FIG. 11). The transition of the output clock signal is timed to extend from a beginning of the transition in a leading one of the input signals to an end of the transition in a lagging one of the input signals, or as shown in FIG. 11, to span the phase angles at which the linear parts of the integrated input signals overlap in time.

Integrating the inputs to the phase interpolator as described produces a substantially more linear output signal slope than alternatives such as FIG. 9, wherein a phase gap between the input rise times produces an irregular output signal transition. Likewise by actively integrating the inputs (FIGS. 1 and 2), the output signal is a smooth ramp as opposed to an exponential charge/discharge curve (FIGS. 12 and 13). FIG. 16 is a graph comparing the differential linearity measure DNL for FIGS. 1 and 2, using active integrators, versus the same measure for FIGS. 12 and 13, using capacitive loading. FIG. 17 is a graph comparing the integral linearity measure INL for FIGS. 1 and 2, using active integrators, versus the same measure for FIGS. 12 and 13, using capacitive loading.

The present subject matter has been disclosed and illustrated in a number of examples, the aspects of which are also capable of embodiment in other ways in keeping with this disclosure. Reference should be made to the appended claims as opposed to the exemplary embodiments, in order to assess the scope of the invention in which exclusive rights are claimed.

What is claimed is:

1. A phase interpolator for producing an output signal interpolated to a phase position between phases of two input signals, comprising:

an amplifier stage coupled to input signals having level transitions at a relative phase difference, the amplifier stages including two differential amplifiers cross coupled such that levels of both input signals contribute to generating level transitions in an output signal, wherein the level transitions are voltage transitions between logic levels;

a current steering control coupled to the respective amplifier stages, the current steering control distributing bias current between the amplifier stages such that a phase position of the level transitions in the output signal is controlled to occur between the level transitions of the input signals, wherein the current steering control comprises dual tail current throttles coupled respectively to the two cross coupled differential amplifiers; and at least one integrator coupled to at least one of the input signals, the integrator extending a rise time of said one of the input signals.

2. The phase interpolator of claim 1, wherein said integrator comprises integrators serially coupled along each of two differential inputs to each of the two differential amplifiers.

3. The phase interpolator of claim 2, wherein each of the integrators comprises an amplifier with an input comprising a series resistance and a capacitor in a feedback loop.

4. The phase interpolator of claim 1, wherein the integrator comprises an active integrator comprising an amplifier with a reactive feedback loop.

5. The phase interpolator of claim 4, wherein the amplifier of the integrator comprises a high gain operational amplifier.

6. A clock data recovery circuit, comprising:

a phase rotator and associated controls operable to produce two phase-spaced clock signals;

a phase interpolator with inputs coupled to the phase-spaced clock signals, the phase-spaced clock signals having level transitions straddling a phase window and the phase interpolator producing an output with a level transition in the phase window, wherein the phase interpolator comprises two cross coupled amplifier stages coupled to the inputs to the phase interpolator;

at least one integrator coupled to at least one of the input signals, the integrator extending a rise time of said one of the input signals; and a current steering control coupled to the respective amplifier stages, the current steering control distributing bias current between the amplifier stages such that a phase position of the level transition in the output signal is controlled to occur between the level transitions of the input signals, wherein the current steering control variably proportions currents between the cross-coupled amplifier stages for adjusting a phase position of the output level transition in the phase window, the current steering control comprising current throttles for adjusting a tail current in the differential amplifiers, wherein the current throttles are responsive to a digital to analog converter numerically controlling a phase position of the output transition in the phase window.

7. The clock data recovery circuit of claim 6, wherein the cross-coupled amplifier stages comprise two differential amplifiers and further comprising integrators serially coupled along each of two differential inputs to each of the two differential amplifiers.

8. The clock data recovery circuit of claim 7, wherein the integrators each comprise an amplifier with serial input resistance and a capacitive feedback loop.

9. A phase interpolation method for providing an output clock signal, comprising:

providing two input clock signals having level transitions with rise times, the level transitions of the input clock signals being spaced to define a phase window during which a transition occurs in the output clock signal;

coupling the input clock signals to cross coupled amplifiers such that an output of the cross-coupled amplifiers carrying the output clock signal has a level transition with a rise time that spans at least part of the rise times of the two input clock signals;

integrating the input clock signals so as to extend the rise times of the level transitions of the two input clock signals, thereby increasing a linearity of the level transition of the output clock signal; and timing the transition of the output clock signal to extend from a beginning of the transition in a leading one of the input signals to an end of the transition in a lagging one of the input signals.

10. The method of claim 9, wherein said integrating comprises coupling the input clock signals through active integrating amplifiers at inputs to the cross coupled amplifiers.

11. The method of claim 10, wherein the active integrating amplifiers are provided with reactive elements tuned to extend the rise times of the input clock signals such that said rise times of the input clock signals overlap in time.

12. The method of claim 10, wherein the active integrating amplifiers are provided with a series resistance and a capacitive feedback path, tuned to extend the rise times of the input clock signals such that said rise times of the input clock signals overlap in time.

13. The method of claim 9, further comprising controlling a phase position of the transition in the output clock signal in the phase window between the level transitions in the input clock signal.

14. A phase interpolator for producing an output signal interpolated to a phase position between phases of two input signals, comprising:

an amplifier stage coupled to input signals having level transitions at a relative phase difference, the amplifier stages being cross coupled such that levels of both input signals contribute to generating level transitions in an output signal;

a current steering control coupled to the respective amplifier stages, the current steering control distributing bias current between the amplifier stages such that a phase position of the level transitions in the output signal is controlled to occur between the level transitions of the input signals; and at least one integrator coupled to at least one of the input signals, the integrator extending a rise time of said one of the input signals to cause each level transition of the output signal to extend from a beginning of a corresponding level transition in a leading one of the input signals to an end of a corresponding transition in a lagging one of the input signals.

15. A clock data recovery circuit, comprising:

a phase rotator and associated controls operable to produce two phase-spaced clock signals;

a phase interpolator with inputs coupled to the phase-spaced clock signals, the phase-spaced clock signals having level transitions straddling a phase window and the phase interpolator producing an output with a level transition in the phase window;

wherein the phase interpolator comprises two cross coupled amplifier stages coupled to the inputs to the phase interpolator;

at least one integrator coupled to at least one of the input signals, the integrator extending a rise time of said one of the input signals to cause the level transition of the output signal to extend from a beginning of the level transition in a leading one of the clock signals to an end of the level transition in a lagging one of the clock signals.

* * * * *